US006252412B1

(12) United States Patent
Talbot et al.

(10) Patent No.: US 6,252,412 B1
(45) Date of Patent: Jun. 26, 2001

(54) METHOD OF DETECTING DEFECTS IN PATTERNED SUBSTRATES

(75) Inventors: Christopher G. Talbot, Emerald Hills; Chiwoei Wayne Lo, Campbell, both of CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/226,967

(22) Filed: Jan. 8, 1999

(51) Int. Cl.[7] .................................................. G01R 31/302
(52) U.S. Cl. ............................................................ 324/750
(58) Field of Search .................................... 324/750, 751; 250/310, 311

(56) References Cited

U.S. PATENT DOCUMENTS

| 4,712,057 | * | 12/1987 | Pau .......................................... 250/310 |
| 5,401,972 | | 3/1995 | Talbot et al. ......................... 250/491.1 |
| 5,493,116 | | 2/1996 | Toro-Lira et al. ..................... 250/310 |
| 5,502,306 | | 3/1996 | Meisburger et al. ................. 250/310 |
| 5,578,821 | | 11/1996 | Meisberger et al. ................. 250/310 |
| 5,777,327 | * | 7/1998 | Mizuno ................................. 250/310 |
| 6,072,178 | * | 6/2000 | Mizuno ................................. 250/310 |

OTHER PUBLICATIONS

Aton, T.J. et al., "Testing Integrated Circuit Microstructures Using Charging–Induced Voltage Contrast", J. Vac. Sci. Technol. B, vol. 8, No. 6, Nov./Dec. 1990, pp. 2041–2044.
Cass, Thomas R., "Use Of The Voltage Contrast Effect For The Automatic Detection Of Electrical Defects On In–Process Wafers", Technology Development Center, ICBD, Hewlett–Packard Co., pp. 506–1–506–11. (Date Unavailable).

Goto, Eiichi et al., "MOL (moving objective lens) Formulation of Deflective Aberration Free System", Optik, vol. 48, No. 3 (1977), pp. 255–270. (Month Unavailable).

Jenkins, Keith A. et al., "Analysis Of Silicide Process Defects By Non–Contact Electron–Beam Charging", IEEE Electron Devices Society and IEEE Reliability Society 30th Annula Proceedings, 1992, (IEEE Catalog No. 92CH3084–1), pp. 304–308. (Month Unavailable).

(List continued on next page.)

Primary Examiner—Ernest Karlsen
Assistant Examiner—Russell M. Kobert
(74) Attorney, Agent, or Firm—Skjerven Morrill MacPherson LLP

(57) ABSTRACT

Defects in a patterned substrate are detected by positioning a charged-particle-beam optical column relative to a patterned substrate, the charged-particle imaging system having a field of view (FOV) with a substantially uniform resolution over the FOV; operating the charged-particle-beam optical column to acquire images over multiple subareas of the patterned substrate lying within the FOV by scanning a charged-particle beam over the patterned substrate while maintaining the charged-particle-beam optical column fixed relative to the patterned substrate; and comparing the acquired images to a reference to identify defects in the patterned substrate. The use of a large- FOV imaging system with substantially uniform resolution over the FOV allows acquisition of images over a wide area of the patterned substrate without requiring mechanical stage moves, thereby reducing the time overhead associated with mechanical stage moves. Multiple columns can be ganged together to further improve throughput.

19 Claims, 11 Drawing Sheets

OTHER PUBLICATIONS

Munro, E. "Design and Optimization Of Magnetic Lenses And Deflection Systems For Electron Beams", J. Vac. Sci. Technol., vol. 12, No. 6, Nov./Dec. 1975, pp. 1146–1150.

Pfeiffer, Hans C., "Recent Advances In Electron–Beam Litography For The High–Volume Production Of VLSI Devices", IEEE Transactions on Electron Devices, vol. ED–26, No. 4, Apr. 1979, pp. 663–674.

Pfeiffer, H.C. et al., "Advanced Deflection Concept For Large Area, High Resolution E–Beam Lithography", J. Vac. Sci. Technol., vol. 19, No. 4, Nov./Dec. 1981, pp. 1058–1063.

Saitou, Norio et al., "Variably Shaped Electron Beam Litography System, EB55: II Electron Optics", J. Vac. Sci. Technol., vol. 19, No. 4, Nov./Dec. 1981, pp. 1087–1093.

Thomson, M.G.R., "The Electrostatic Moving Objective Lens And Optimized Deflection Systems For Microcolumns", J. Vac. Sci. Technol. B, vol. 14, No. 6, Nov./Dec. 1996 pp. 3802–3807.

Thong, John T.L., "Electron Beam Testing Technology", Microdevices Physics and Fabrication Technologies, pp. 41–62.

* cited by examiner

METHOD OF DETECTING DEFECTS IN PATTERNED SUBSTRATES

RELATED PATENT APPLICATIONS

This application is related to co-pending U.S. patent application Ser. No. 08/892,734 filed Jul. 15, 1997, now pending, U.S. patent application Ser. No. 08/782,740 filed Jan. 13, 1997, now abandoned, U.S. patent application Ser. No. 09/012,227 filed Jan. 23, 1998, U.S. Pat. No. 5,162,621, U.S. patent application Ser. No. 09/226,962 filed on the same date as this application, now pending, U.S. patent application Ser. No. 09/227,747 filed on the same date as this application, now pending, and U.S. patent application Ser. No. 09/227,395 filed on the same date as this application, now pending, the contents of which are incorporated herein by this reference.

BACKGROUND OF THE INVENTION

1. Field of the Invention

The invention relates to detection of defects in patterned substrates, such as semiconductor wafers, particularly by inspection using an electron beam.

2. The Prior Art

It is generally accepted that the most economical approach to increasing yields of semiconductor devices is to detect defects as early as possible during fabrication, rather than at final test of the devices. Early detection can allow a source of defects to be identified and eliminated before large numbers of wafers are affected. Thus, it is now standard industry practice to inspect wafers for defects at multiple stages of fabrication.

In-line inspection is now mostly done using optical inspection tools such as the 21XX-series wafer-inspection tools of KLA-Tencor. These employ a high-performance optical microscope, a fast scanning stage, a time-delay-integration, fast-scanning CCD image sensor, and a multi-processor image-processing computer. Algorithms are provided which perform pixel-by-pixel comparison of an optical image of a die against images of one or two neighboring die or dice, or pixel-by-pixel comparison of an optical image of a memory cell against neighboring memory cells. Other optical inspection systems are supplied, for example, by Applied Materials, formerly Orbot, and Hitachi.

Optical tools are inherently limited by diffraction and depth of focus. As a result, more than 50% of killer defects arising in processes using <0.35 $\mu$m design rules prove to be optically undetectable defects. Killer defects are defects which adversely affect electrical performance of a device at final test of the device. Trends indicate that this problem will become worse, especially for metal interconnect layers with sub-surface defects. This is due to the small depth of focus of conventional optical inspection tools, an inherent limitation of the large numerical aperture objective lenses required to image sub-micron features. Thus any defect that is not at the device surface will be substantially out of focus and therefore undetectable. Examples of such sub-surface defects include polysilicon gate shorts, open vias and contacts, and metal stringers. All of these result in either an electrical "open" or "short" type defect. Also, diffraction-limited resolution renders small surface defects undetectable as minimum critical dimensions (CDs) shrink below 0.25 $\mu$m. These include defects such as ~0.1 $\mu$m particles and regions of missing or extra pattern which are at or below the minimum CD.

Conventional scanning-electron-microscope (SEM) and electron-beam prober technology can image these small surface defects. E-beam probers can also "observe" (detect) sub-surface defects by measuring the voltage-contrast change resulting from the electrical effect of killer defects, i.e., "open" and "short" type defects. See, for example: T. ATON et al, Testing integrated circuit microstructures using charging-induced voltage contrast, J. VAC. SCI. TECHNOL. B 8 (6), November/December 1990, pp. 2041–2044; K. JENKINS et al., Analysis of silicide process defects by non-contact electron-beam charging, 30$^{TH}$ sc ANNUAL PROCEEDINGS RELIABILITY PHYSICS 1992, IEEE, March/April 1992, pp. 304–308; J. THONG, ED., ELECTRON BEAM TESTING TECHNOLOGY, Plenum Press 1993, p. 41; and T. CASS, Use of the Voltage Contrast Effectfor the Automatic Detection of Electrical Defects on In-Process Wafers, KLA Yield Management Seminar, pp. 506–2 through 506–11.

Conventional SEMs are too slow, however, to cover a statistically significant wafer area or number of defects in a short enough period of time. This limitation stems primarily from the slow serial nature of the data-collection process, though also in part from a general lack of automation. In addition the time taken to move the mechanical stage to each new imaging position is large compared to the imaging time and thus limits throughput even with automation features.

KLA's SEMSpec system is based on a conventional optical inspection system having a mechanical scanning stage. It uses a continuously-moving, accurate scanning stage together with a high-current beam and a high-bandwidth detector to increase the area-coverage rate. The scanning stage reduces stage-move time as a primary limiting factor in system throughput. The overall area-coverage rate of ~1 cm$^2$/hour with the SEMSpec system is substantially less that the several thousands of cm$^2$/hour with fully automated optical tools. See, for example, U.S. Pat. No. 5,502,306 and U.S. Pat. No. 5,578,821 to Meisburger et al.

Co-pending U.S. patent applications Ser. No. 08/782,740 filed Jan. 13, 1997, now abandoned, and Ser. No. 09/012,227 filed Jan. 23, 1998, now U.S. Pat. No. 6,162,621, disclose another approach to obtaining higher rates of area coverage, at least for conductive layers. The conductive layers are pre-charged and then "under-sampled" where features are typically long, thin, co-parallel wires. For example, FIG. 1 illustrates pre-charged 10× undersampling of an IC layer 100 having conductors such as 105 and 110 oriented mostly in a single direction. The sanple surface is precharged and only one of ten lines is sampled. Shown at 115 is the e-beam-sampling scan path. The layout of a typical logic IC maximizes routing density by orienting conductors of alternate layers in mutually-orthogonal directions—conductors of one layer are routed mostly in the x-direction while conductors of adjacent layers are routed mostly in the y-direction. The pre-charged, under-sampling approach offers much benefit with layers having characteristics suited to under-sampling. It is unfortunately not as effective with layers having other characteristics, e.g., layers with small features such as vias, contacts, localized interconnects and memory cells. This approach also unlikely to detect small particles or missing or extra pattern.

A result is that, in many situations, e-beam-based defect detection is only feasible with full imaging rather than undersampling. Full-imaging with an area-coverage rate of ~1 cm$^2$/hour would take an estimated ~270 hours to cover all of a typical 200 mm-diameter wafer. To improve throughput, it is instead desirable to selectively sample areas of the wafer that are expected to have the most defects of interest. It is also advantageous to be able to compare against any reference die, or against a database, rather than against only a neighboring die as is the case with scanning-based optical inspection systems currently in use and with the SEMSpec system.

The ability to compare an image of a die against any reference allows sampling of the wafer area to be targeted at a specific defect distribution. For example, comparing the center die of a wafer, which is more likely to be defect free, with edge dice, which are often expected to have higher defect densities, maximizes the likelihood of detecting such defects. FIG. 2 illustrates a desired sampling scenario tailored for a specific defect distribution, but which is not addressed by prior art systems. In this example a center die 200 of wafer 205 is selected as a reference and is compared to outlying die 210 which are more likely to have defects. Comparing a die to an adjacent die would be less likely to show all the defects.

It is believed that commercially available e-beam defect detection systems only look at memory arrays by comparing one memory cell against its neighbors. While a scanning stage-based system might be used to perform a die to any die comparison, the scanning stage turn-around time would be a primary overhead factor limiting throughput. FIGS. 3A an 3B illustrate the effect of state turn-around time.

FIG. 3A shows the path 300 of a continuously moving stage (not shown) relative to an area 305 of a wafer being scanned. Image data is acquired while the stage is moving at a constant velocity. The average rate of data acquisition is reduced by the time required for the mechanical stage to decelerate, reverse direction, and accelerate to scanning speed, and the time required to realign the beam with the sample. FIG. 3B illustrates the overscan resulting from use of a continuously moving scanning stage. To scan an area 310 of wafer 315 at a constant velocity, the stage must move beyond the edge of the scanned area 310 for deceleration, reversal, and acceleration. The scan path of the stage relative to area 310 is shown at 320.

A goal for a charged-particle-beam defect-detection system to be used in a production environment is to minimize or eliminate stage overhead so that acquisition speed is limited by the fundamental physics of the beam, thus taking best advantage of charged-particle beam technology to detect optically undetectable defects (OUDs).

In general, a wide range of potential reference image sources can be used, each having relative advantages and disadvantages in specific applications. The most versatile approach is to have complete flexibility in sampling and choice of reference without compromising throughput. Presently available systems lack such flexibility. Following is a description of some desired comparisons.

| Comparison | Comments |
| --- | --- |
| Cell to Cell | Typically used for memory cells. A perfect reference cell may be used to compare to every cell in a memory array, or each memory cell (or repeating structure such as a block of 2 or 4 symmetrically-reflected cells) is compared with its neighbor. |
| Die to die | This is typically a standard mode of operation for an optical inspection system such as the KLA213X. Each die is compared to its adjacent neighbor during the scanning process. A third die is then used to arbitrate which die actually has the defect. This works well for random defects but not for repeating defects such as extra pattern in a tightly-routed section of the mask. In general, it is preferred to have the capability to efficiently compare any die with any die, using any third die for arbitration. Die to any die comparisons are valuable because the user can target specific areas of the wafer with a particular expected defect type and compare against a die that is likely to be good. Edge die to center die comparison on a semiconductor wafer is desirable for this reason, since edge die are often "weak" and less likely to yield than center die. |
| Die to golden die | An image or other data from a known-good reference die ("golden" die) on another wafer is stored in memory and compared to the die under inspection. A large volume of data is required, literally hundreds of gigabytes, but disk and memory space is becoming less costly and there is potential for image compression of voltage contrast images. No arbitration is required when comparing with a "golden" die. |
| Die to database | This technique is known for inspection of masks, such as in KLA's mask inspection systems. A challenge with the apparent-feature enlargement approach is that multiple layers of the database and knowledge of the electrical properties of the circuit represented are required to determine which features are grounded and which are floating in negative charge mode, e.g., which p-n junctions are forward biased by the negative potential or voltage. |
| Block to block | Similar to die to die but just some subsection(s) of the die are compared. This is useful when a portion of the die is known or expected to be more likely to have a particular type of defect of interest. This approach saves time over full die-to-die comparison. |

Conventional SEM columns are optimized for best imaging performance for a relatively small Field of View (FOV), typically within 1 $\mu$m to 100 $\mu$m of the column's optical axis. Mechanical stages move the sample wafer and column relative to one another to allow viewing of the complete sample. This is acceptable in applications where throughput is not a major concern, and is believed to be the norm in commercial SEMs. Particle-beam systems are known to operate over a large field of view (FOV) for purposes such as e-beam lithography, but not for defect detection. See, for example, H. PFEIFFER, Recent Advances in Electron-Beam Lithographyfor the High-Volume Production of VLSI Devices, IEEE TRANSACTIONS ON ELECTRON DEVICES, Vol. ED-26, No. 4, April 1979; and N. SAITOU et al, Variably shaped electron beam lithography system, EB55: II ELECTRON OPTICS, J. VAC. SCI. TECHNOL., 19(4), November/December 1981. It is also known to use a large FOV for overlay alignment, as in U.S. Pat. No. 5,401,972 to Talbot et al. and in Schlumberger's commercially-available IDS P2X and AMS systems.

Improved systems and methods are needed for detection of defects on a patterned substrate.

SUMMARY OF THE INVENTION

A method consistent with the invention for detecting defects in a patterned substrate comprises: positioning a charged-particle-beam optical column relative to a patterned substrate, the charged-particle imaging system having a field of view (FOV) with a substantially uniform resolution over the FOV; operating the charged-particle-beam optical column to acquire images over multiple subareas of the patterned substrate lying within the FOV by scanning a charged-particle beam over the patterned substrate while maintaining the charged-particle-beam optical column fixed relative to the patterned substrate; and comparing the acquired images to a reference to identify defects in the patterned substrate.

Apparatus consistent with the invention for detecting defects in a patterned substrate comprises a mechanical stage for positioning a charged-particle-beam optical column relative to a patterned substrate; a charged-particle optical column having a field of view (FOV) with a substantially uniform resolution over the FOV, the charged-particle-beam optical column being operable to acquire images over multiple subareas of a region of the patterned substrate lying within the FOV by scanning a charged-particle beam over the patterned substrate while the mechanical stage maintains the charged-particle-beam optical column fixed relative to the patterned substrate; and at least one processor operable to compare the acquired images to a reference to identify defects in the patterned substrate.

A further method consistent with the invention of detecting defects in a patterned substrate comprises: positioning a charged-particle-beam optical column relative to a patterned substrate, the charged-particle optical column having a field of view (FOV) greater than 100 microns with a substantially uniform resolution over the FOV; operating the charged-particle-beam optical column to acquire an image of substantially all of the FOV by scanning a charged-particle beam over the patterned substrate while maintaining the charged-particle-beam optical column fixed relative to the patterned substrate; and comparing the acquired image to a reference to identify defects in the patterned substrate.

Further apparatus consistent with the invention for detecting defects in a patterned substrate comprises: a mechanical stage for positioning a charged-particle-beam optical column relative to a patterned substrate; a charged-particle optical column having a field of view (FOV) greater than 100 microns with a substantially uniform resolution over the FOV, the charged-particle-beam optical column being operable to acquire an image of substantially all of the FOV by scanning a charged-particle beam over the patterned substrate while the mechanical stage maintains the charged-particle-beam optical column fixed relative to the patterned substrate; and at least one processor operable to compare the acquired images to a reference to identify defects in the patterned substrate.

These and other features consistent with the invention will become apparent to those of skill in the art from the illustrations and description which follow.

DETAILED DESCRIPTON

A goal for e-beam-based defect detection is to minimize the effect of stage-move-time and settling-time overhead in the overall time needed for the system to acquire image data System throughput in the most versatile imaging-mode of operation should be limited only by the physics of interaction between the e-beam and the sample. It is also desirable to compare any die or die portion on the wafer to any other die or die portion on the wafer or to a stored reference image from another wafer or a CAD database, without significantly degrading system throughput.

Embodiments consistent with the present invention address this need by using a large-FOV objective lens having substantially constant resolution over the large FOV. Mechanical-stage overhead is minimized by using the e-beam as a near-ideal mini-stage, similar to a mass-less stage in the field of light optics. For each mechanical stage position, images are acquired at multiple sub-fields of view (sub-FOVs). Because e-beam deflection, alignment and settling times are negligible compared to the image acquisition time for a single sub-FOV, the time required to move from one image-acquisition area to another is substantially eliminated. Because a large number (~100 s) of sub-FOVs can be acquired for each mechanical stage position, the time required for mechanical stage movement and settling is negligible compared to the total acquisition time for a complete lens FOV encompassing hundreds of sub-FOVs. Hence the effect of stage-movement overhead is a small part of the total time needed to acquire images at many regions of a wafer.

A high-speed defect-detection system consistent with the invention is suitable for inspection of semiconductor wafers before fabrication is completed. It employs a large field of view (FOV) objective lens to reduce the time overhead associated with mechanical-stage moves. The main FOV of the lens, covering for example a region of ~1 mm×~1 mm, is sub-divided into hundreds of sub-FOVs. The system can acquire images of a sample within each sub-FOV without the need for a mechanical-stage move. An in-lens detector is optimized for collecting and detecting secondary electrons efficiently and uniformly across the full FOV of the large-FOV objective lens. We term this a "step-and-image" technique, as distinguished from prior-art techniques employing substantially-continuous stage motion during image acquisition.

Figure 1:
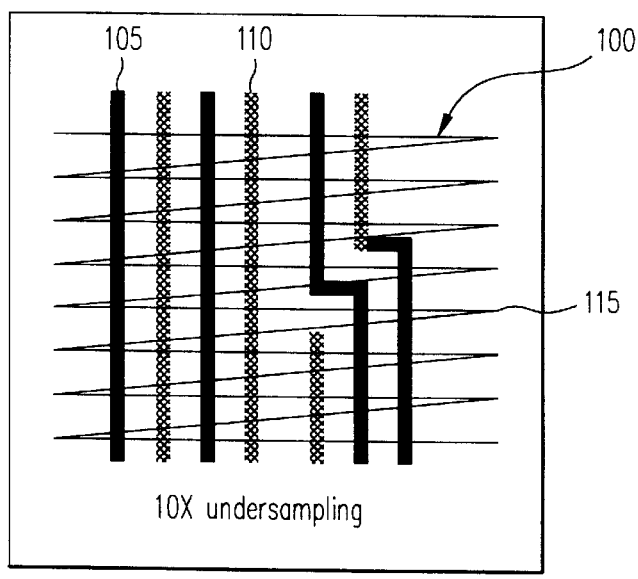
FIG. 1 illustrates pre-charged 10× undersampling of an IC layer having conductors oriented mostly in a single direction.
Figure 2:
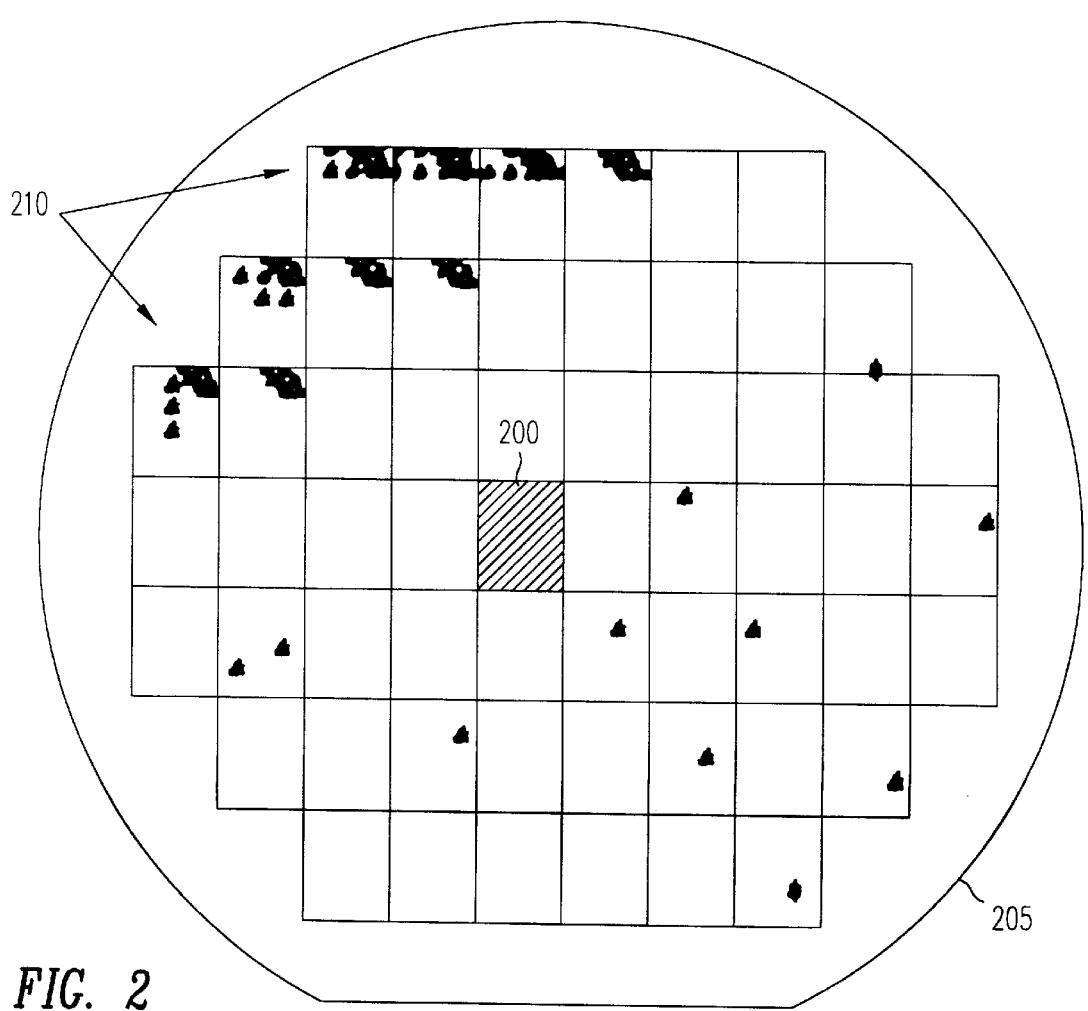
FIG. 2 illustrates a typical sampling scenario tailored for a specific defect distribution.
Figure 3A:
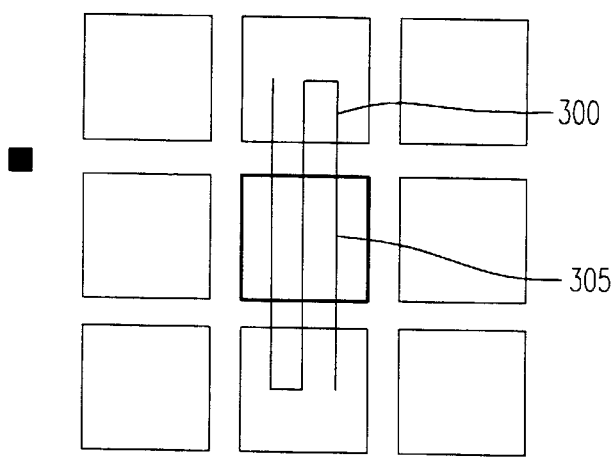
FIG. 3A illustrates stage movement with a continuously moving stage.
Figure 3B:
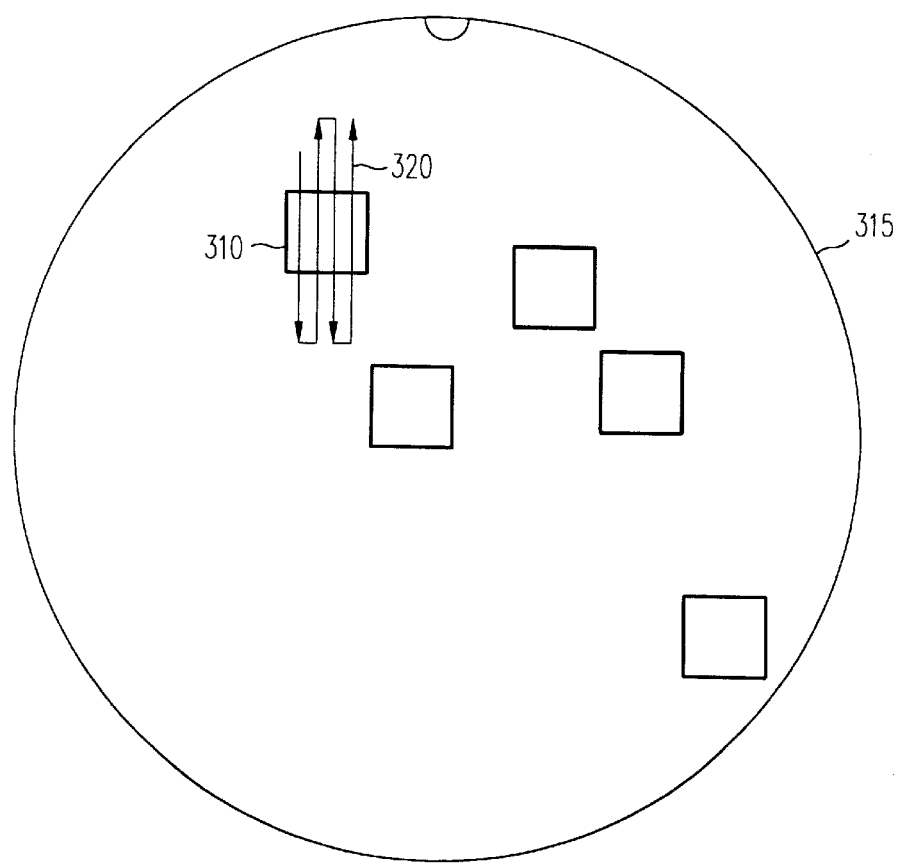
FIG. 3B illustrates overscan resulting from use of a continuously moving scanning stage.
Figure 4:
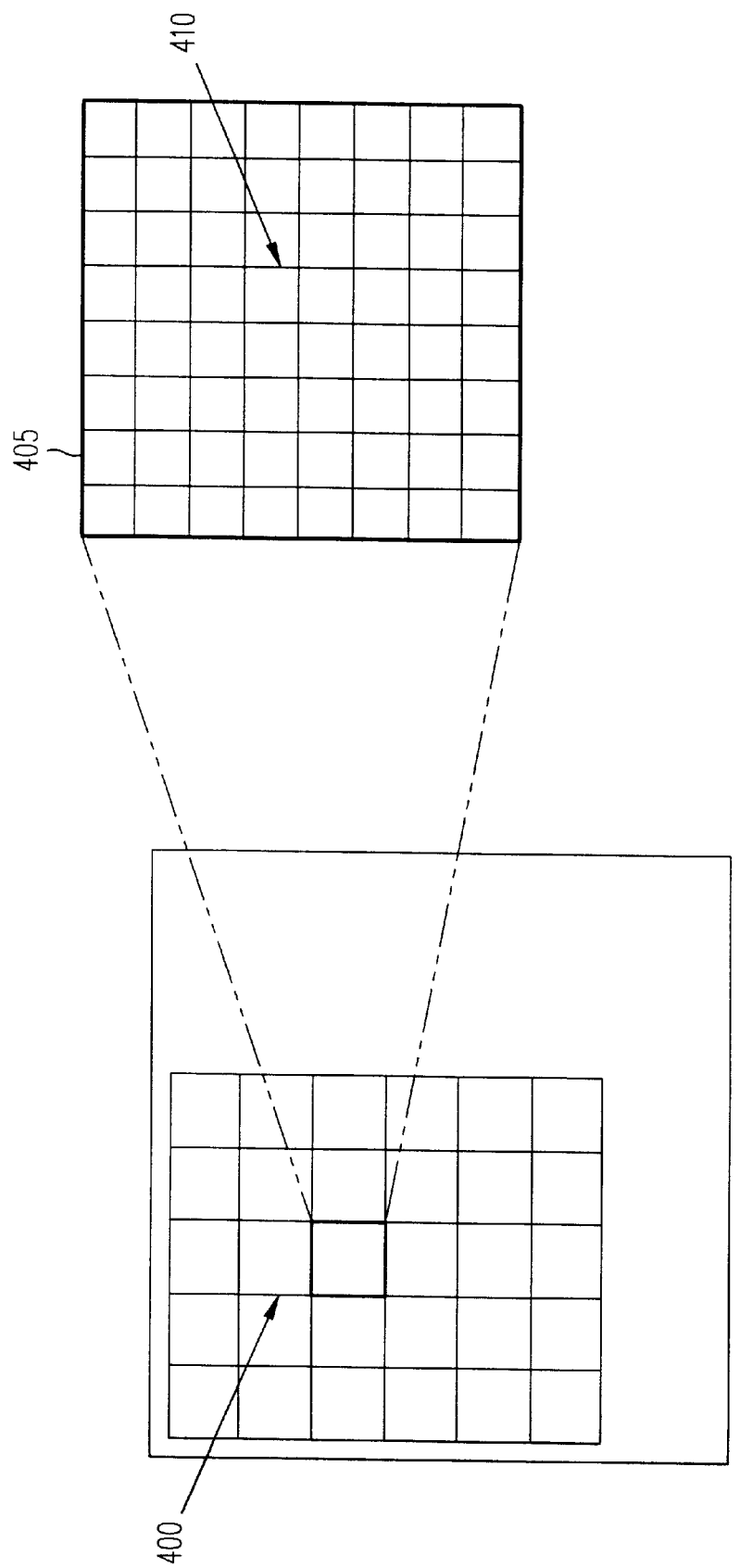
FIG. 4 illustrates an image-acquisition scheme consistent with the invention.
Figure 5:
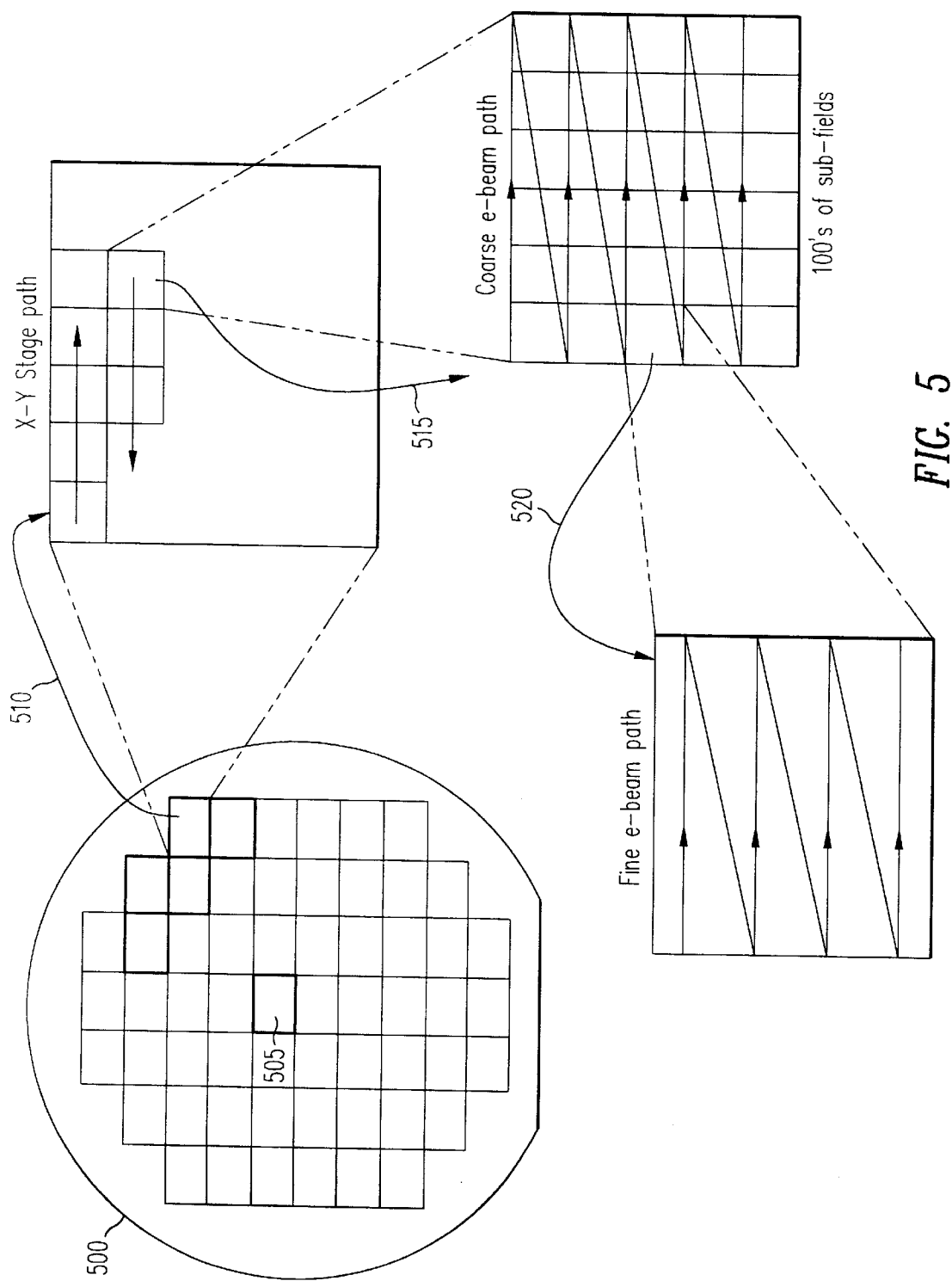
FIG. 5 further illustrates an image-acquisition scheme consistent with the invention.

FIG. 4 and FIG. 5 illustrate principles of an image-acquisition scheme consistent with the invention. Shown in FIG. 4 is an example of applying the large-FOV objective lens in a step-and-image technique to acquire tiled images from a single die. Region 400 of a wafer contains a die or die portion to be inspected. Region 400 can be divided as shown at 405 into multiple sub-regions, such as 1 mm by 1 mm sub-regions. Each of these sub-regions represents a FOV of a large-FOV e-beam column; for a given position of the mechanical stage which establishes relative position between the sample wafer and the e-beam column, the e-beam column is capable of acquiring images over a corresponding large-FOV sub-region. With the mechanical stage positioned for image acquisition over sub-region 410, the e-beam can be scanned to acquire images over many sub-FOV areas, typically hundreds of sub-FOV areas. With the mechanical stage held stationary, the e-beam can be stepped nearly instantaneously between sub-FOV areas for image-acquisition scanning within sub-FOV areas.

FIG. 5 illustrates an example of using a large-FOV e-beam column to acquire images for detecting defects on a wafer 500. In this example, an image of a center die 505 is acquired and used as a reference image for comparison with images of several edge dice, such as edge die 510. The mechanical stage is moved to a position such that a die portion 515 can be imaged by the large-FOV e-beam column without further movement of the mechanical stage. Die portion 515 contains many, e.g., hundreds, of sub-FOVs. The e-beam is directed to the vicinity of a sub-FOV such as sub-FOV 520, and is scanned over the sub-FOV so as to acquire an image of the sub-FOV region of the die.

Embodiments of the present invention have the potential for relatively simple implementation. Prior-art large-FOV lithography systems use complex dynamic-focus and aberration-correction schemes to overcome changes in lens aberrations as the beam is moved across the full FOV. Such complex schemes are not required for defect detection consistent with the invention because only a finite number of specific sub-FOV images are used for acquisition of a particular image. A lookup-table approach can thus be used to statically correct the focus and the aberrations at each FOV. Interpolation between entries in the lookup table can also be used to reduce the size of the lookup table.

"Step and image" techniques consistent with the invention can provide throughput and implementation advantages for voltage-contrast-based defect detection as well as the conventional surface- or topographic-imaging-based defect detection using an e-beam. The following examples illustrate overhead and throughput advantages of a system employing a large-FOV lens and a stepping stage relative to a prior-art system using a small-FOV lens and a continuously-scanning stage for inspecting a single die on a wafer.

EXAMPLE 1

The following typical parameters are assumed for "Case 1" and "Case 2":

die size=1 cm$^2$ pixel resolution=25 nm pixel rate=100 MHz

FOV of small-FOV lens=25 $\mu$m×25 $\mu$m (1,000 pixels per line, same as the sub-FOV of large-FOV lens)

FOV of large-FOV lens=1 mm×1 mm time for a single stage move=1 second time for scanning stage to reverse direction and re-accelerate to constant speed=~3 seconds Case 1: Time to acquire image of a single die using large FOV lens with step and image mode (consistent with the present invention)

Stage-Move Overhead: 100 stage moves=100 seconds

Data acquisition time: acquire 16×10$^{10}$ pixels=1600 seconds

Total time required: stage moves+acquisition=1700 seconds

Efficiency (data acquisition time/total time): 1600/1700= 94%

Case 2: Time to acquire image of a single die using small FOV lens with a continuously scanning staging (prior art)

Stage-Move Overhead: time to reverse stage direction & re-accelerate 800 times=2400 seconds Data acquisition time: acquire 16×10$^{10}$ pixels=1600 seconds Total time required: stage moves+acquisition=4000 seconds Efficiency (data acquisition time/total time): 1600/4000= 40%

EXAMPLE 2

As indicated in Table 1 below, this example assumes a 1 mm×1 mm FOV for the large-FOV objective lens and a 40 MHz pixel-data acquisition rate. The time for the stage to move and settle is conservatively assumed to be 1 second (typically a well-designed stepping stage would move and settle in <0.5 second). With these assumptions, the stage move overhead represents ~3% of the total image acquisition time. That is, an ideal stage which would move and settle instantaneously would only result in only a ~3% through-put increase. Thus the stage-move overhead is of little consequence.

TABLE 1

| Critical Dimension(CD) = | 0.18 um | No pre-charge | |
|---|---|---|---|
| Pixels/CD = | 4 | Data rate = | 4.00E + 07 Hz |
| Pixel size = | 0.045 um | Avg. = | 2 |
| Pixels/cm = | 222222 | Time/sub FOV = | 0.05 s |
| Pixels/cm$^2$ = | 49382716049 | Beam vector time = | 200 us |
| | | Total time/ sub FOV = | 0.05 s |
| FOV (per side) = | 1 mm | Time/FOV = | 24.8 s |
| FOV/cm$^2$ = | 100 | | |
| Pixels/FOV line = | 22222 | Stage move/ settle time = | 1 s |
| Pixels/sub FOV line = | 1000 | Overhead (focus, etc) = | 0.1 s |
| Sub FOV/line = | 22.2 | Total time/FOV = | 25.9 s |
| Sub FOV size = | 45 um | Total time/cm$^2$ = | 2589.012346 s |
| Sub FOV/FOV = | 493.8 | Total time/cm$^2$ = | 0.719170096 hrs |
| | | Data vol./Lg FOV = | 1036 MB |

Figure 6A:
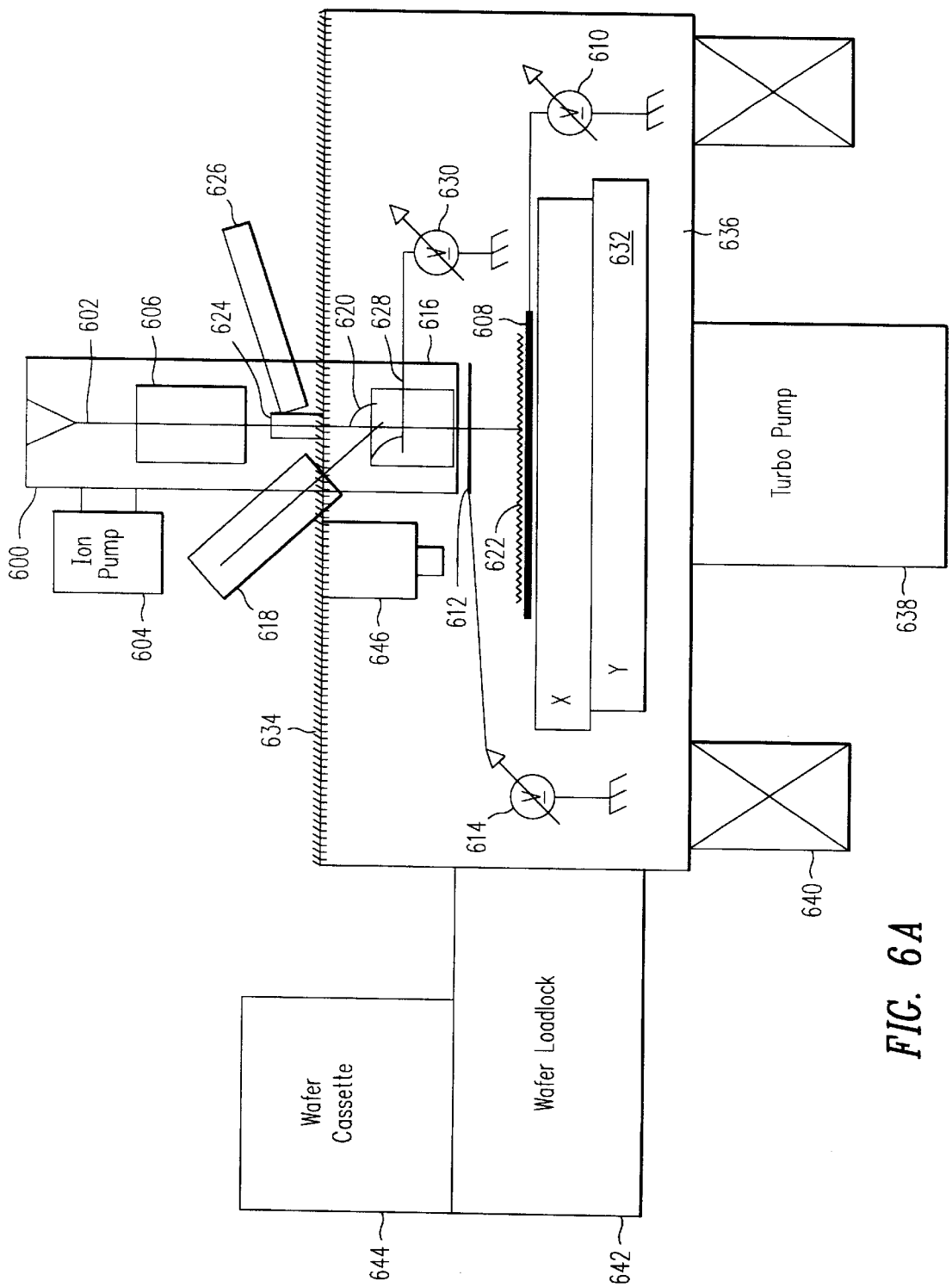
FIG. 6A schematically illustrates the column, stage and chamber section of a defect-detection system consistent with the invention.
Figure 6B:
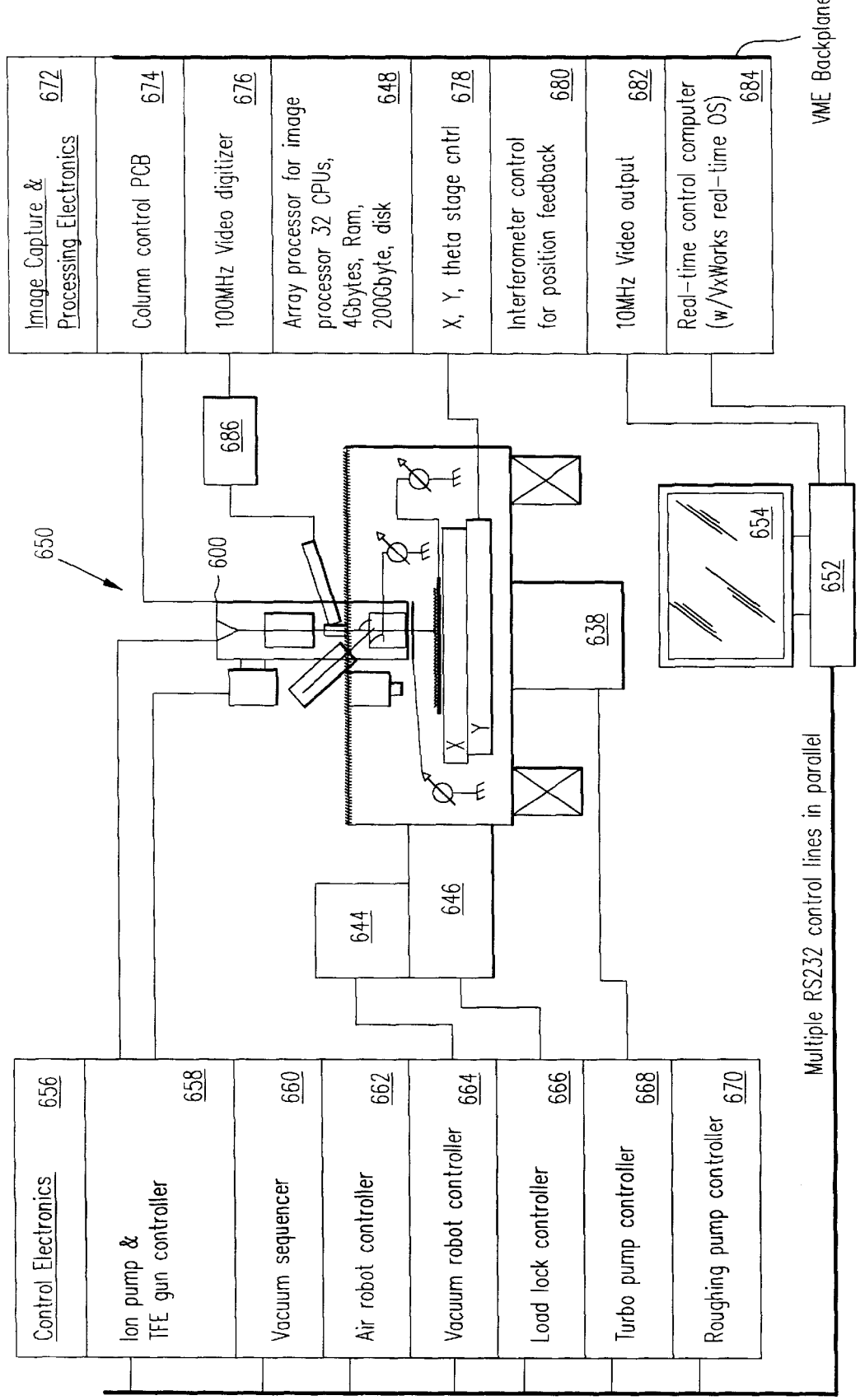
FIG. 6B schematically illustrates the high-level architecture of a defect-detection system consistent with the invention.

A system consistent with the present invention for e-beam-based detection of defects in patterned wafers is shown schematically in FIG. 6A and FIG. 6B. FIG. 6A shows the column, stage and vacuum-chamber section of the system. FIG. 6B shows high-level system architecture. Referring to FIG. 6A, electron-optical column 600 has an electron source 602 such as a Thermal Field Emission (TFE) electron source of the type used in most modem SEMs, for example with a zirconium-tungsten cathode. The electron source includes an electron gun (not shown) pumped directly by an ion pump 604. High vacuum in the electron gun is separated from the rest of the column and chamber by a differential pumping aperture (not shown), as in most modern scanning-electron microscopes (SEMs). The primary beam landing energy is adjustable, for example in the range from 700 eV to 1.5 keV. Beam current at the specimen is adjustable, such as with a condenser lens 606 and beam limiting aperture (not shown), for example in the range from ~500 pA to ~10 nA, or even up to 25–50 nA into a spot size of <0.1 μm. Electron-optical column 600, together with wafer-chuck 608 having a bias source 610 and extraction electrode 612 having a bias source 614, form a Local Charge Control Module (LCCM).

Electron-optical column 600 includes a large Field Of View (FOV) objective lens 616, such as a Variable Axis Immersion lens (VAIL). Objective lens 616 can be a VAIL lens similar to that used in the Schlumberger ATE IDS 5000 and IDS 10000 e-beam probing systems. For example, the lens is a magnetic-immersion type where the specimen is held approximately at the point of maximum axial magnetic field. The field of such a lens acts as a "magnetic bottle" and allows for collimation and efficient collection of secondary electrons without the need to apply a strong electrostatic collection field. A strong electrostatic collection field is undesirable as it may cause unstable surface charging and can preclude independent optimization of the wafer bias, extraction potential and energy filter to enhance voltage contrast. The lens can be equipped with both pre-deflection and deflection coils to achieve a large FOV (such as 0.25 mm to 1.5 mm across) with high resolution (such as 30–100 nm). In one embodiment, a FOV of 0.25–1.5 mm across has been demonstrated with resolution of <50 nm. An embodiment of a VAIL lens consistent with the present invention is described below with reference to FIG. 8.

As shown schematically in FIG. 6A, the objective lens assembly is equipped with an "In-The-lens" flood gun 618 and a flood-beam bending electrode 620 that allows fast multiplexing between a broad, high-current flood beam for pre-charging the specimen and its conductors, and a high-resolution primary-imaging beam for fast imaging to interrogate the charge states of the specimen's conductors. Fast imaging is performed, for example, at a pixel acquisition rate of 10 MHz to 100 MHz. Flood gun implementation is described in co-pending U.S. patent applications Ser. No. 08/82,740 filed Jan. 13, 1997, now abandoned, and Ser. No. 09/012,227 filed Jan. 23, 1998 now U.S. Pat. No. 6,162,621. Flood gun 618 in combination with the wafer chuck 608 having bias 610 and extraction electrode 612 having bias 614 form a Global Charge Control Module (GCCM).

Secondary electrons and, in general, other secondary particles are generated at the surface of the specimen 622 by raster-scanning the primary beam over the surface. These secondary electrons and other secondary particles are collected by the lens field, travel back through the bore of the lens and are separated from the primary electron beam by a Wien filter 624. A Wien filter has crossed magnetic and electric fields. Secondary electrons are then detected by an electron detector 626, such as a scintillator-PMT combination, also known as an Evahart-Thornley detector. Other detector combinations can also be used. Provision is advantageously made to shield the electron detector against damage or rapid aging from the strong secondary electron current generated when the flood beam is in use. The detector supplies a signal which can be used to form an image of the scanned region of the specimen.

In the embodiment of FIG. 6A, provision is made to apply independent bias voltages to extraction electrode 612 from bias source 614 and to wafer chuck 608 from bias source 610. Bias voltage applied to wafer chuck 608 is effectively applied also to the substrate of wafer 622. These bias voltages can be independently set, under computer control if desired, to optimize voltage contrast depending on the type of wafer being imaged and the type of defect to be detected. As described in more detail in co-pending U.S. patent application Ser. No. 08/892,734 filed Jul. 15, 1997, now pending, the system can be operated to produce either a positive or a negative specimen-surface voltage. The wafer bias can also be used to independently vary the beam-landing energy at the specimen's surface; this is desirable as some specimens with thin layers such as salicide require low landing energy without compromising resolution, to prevent charge leakage to other layers from beam punch-through.

In the embodiment of FIG. 6A, the bore of the lens is equipped with a planar filter electrode 628, also called an energy-filter mesh, having a bias voltage source 630. Electrode 628 serves as a retarding-field electron-energy spectrometer, as in the Schlumberger IDS 5000 & IDS 10000 systems. The energy filter can be used to optimize voltage contrast for certain wafer types by collecting secondary electrons with a specified energy range, for example in the range from zero to ~15 eV.

The embodiment of FIG. 6A also includes an x-y stage 632, which can be a high-speed stage equipped to handle wafers up to 300 mm diameter, allowing inspection of the entire upper surface of the wafer. The wafer is supported on a chuck 608 such as an electrostatic-type chuck. In general, the stage used should be suitable for use in a vacuum environment, non-magnetic to minimize unwanted beam deflection, clean-room compatible and reasonably accurate. There is a direct trade-off between stage accuracy and image alignment software overhead. For a "step-and-image" mode of operation consistent with the present invention, a key performance goal is fast, accurate stepping with a short settling time after each mechanical step/move. The stage should thus be capable of high-speed operation as well as precise scanning and stepping operation, to enable detection of the widest possible range of defects. For example, the stage may have a settling time of <0.3 second, a linear speed of 100 mm/second, and laser-interferometer feedback for positional accuracy within ~0.1 μm. To assure such high stage-position accuracy, the mechanical path between stage 632 and electron-optical column 600 must be sufficiently rigid. In one embodiment, the roof 634 of vacuum chamber 636 is used as a metrology plate, fabricated of 5" thick aluminum re-enforced with an external H-frame. Electron-optical column 600 and precision stage 632 can be directly mounted on the metrology plate to minimize relative motion. A laser interferometer (not shown) can be used to provide accurate position feedback to the stage's motor controllers (not shown). More subtle position errors, also detected by the interferometer, are readily corrected by small deflections of the e-beam.

In the embodiment of FIG. 6A, vacuum chamber 636 is pumped directly by a turbo pump 638 and an oil-free backing pump (not shown). As illustrated, vacuum chamber 636 is mounted on an active vibration isolation platform 640 which cancels environmental vibration and also predictively cancels motion due to fast acceleration and deceleration of mechanical stage 632. A wafer load-lock subsystem 642 is included to minimize wafer change over time and to allow the main vacuum chamber to stay at high vacuum, such as 1E-6 Torr, for long periods. Maintaining vacuum also minimizes hydrocarbon contamination of the wafer.

Wafer load-lock subsystem 642 includes wafer-handling robots for automatic loading and unloading of wafers. For example, a first robot moves wafers from a wafer cassette 644 to a load-lock chamber. After the load-lock is evacuated, robot operating in the vacuum environment of the vacuum chamber places the wafer on chuck 608 of precision stage 632. The load-lock chamber advantageously is designed to accommodate several wafers to facilitate pipeline operation and simultaneous loading and unloading of wafers. Wafer-load-lock subsystem 642 can also advantageously include an optical wafer pre-aligner to provide a degree of wafer alignment accuracy relative to stage 632.

Additional optical elements can be provided to more accurately align the wafer on the precision stage, such as an optical pre-alignment subsystem 646 having an optical microscope and CCD video camera for providing optical images to a pattern matching system. The pattern matching system can take the form of suitable software, from Cognex or another vendor, running on a processor to determine the actual position of the wafer relative to the precision stage. Alignment using e-beam images is sometimes possible, though for some semiconductor process layers, fiducial marks on the wafer and die can appear in low contrast in the e-beam image. This can make e-beam image-based alignment unreliable. Optical microscopes can see through insulating layers such as $SiO_2$, $Si_3N_4$ and make alignment more robust.

Referring to FIG. 6B, data processing for image alignment and image comparison is carried out in an image-processing subsystem 648, such as a multiprocessor-array computer from Mercury Computer Systems of Chelmsford, Mass. Image-processing subsystem 648 includes video input and output boards, an array of processors, random-access memory, and a large disk store. For example, image-processing subsystem 648 may comprise an array of thirty-two 300 MHz Power PC processors, 4 GBytes of RAM and a ~200 GByte disk store for storage of reference images and defect data. Image-processing subsystem 648 can be programmed to execute a range of image processing algorithms including but not limited to: cell-to-cell comparison for memories, die-to-die comparison or die-to-reference for random logic, and feature-based comparison for contacts and other layers. Feature-based comparison is described in more detail, for example, in co-pending U.S. patent application Ser. No. 09/227,747 filed on the same date as this application, now pending.

A defect-detection system 650 as illustrated in FIG. 6B includes a control computer 652, such as a personal computer having a display 654 and a Pentium processor running the Windows NT operating system and system control software (not shown). Defect detection system 650 also includes control electronics 656 under control of computer 652 for providing signals to operate the described system elements. Defect-detection system 650 advantageously includes a multi-level, easy to use, graphical user interface (not shown) to support use by operators in an automated-factory environment based on pre-defined stored defect detection recipes as well as by engineers, typically having a higher skill set, in a laboratory or process-development environment. Software can be provided for functions such as system control, image processing, automatic beam setup, beam alignment, auto-focus and auto-astigmatism correction.

Control electronics 656 includes, for example, an ion-pump and TFE-gun controller 658, a vacuum-sequencer 660, an air-robot controller 662, a vacuum-robot controller 664, a load-lock controller 666, a turbo-pump controller 668, and a roughing-pump (backup-pump) controller 670.

In the implementation of FIG. 6B, image-processing subsystem 648 forms part of image-capture processing electronics 672, which also includes an electron-optical-column controller 674, a video digitizer 676, a mechanical-stage controller 678, an interferometer controller 680 for mechanical-stage-position feedback, a video output stage 682 for supplying an image signal to control computer 652 for display, and a real-time control computer 684 having a real-time operating system such as VxWorks or the like. The signal from electron detector 626 (FIG. 6A) is supplied to a low-noise video amplifier 686, which may have autofocus signal capability and which passes the electron-detector signal to video digitizer 676.

As discussed in E. MUNRO, Design and optimization of magnetic lenses and deflection systems for electron beams, J. VAC. SCI. TECHNOL., Vol. 12, No. 6, November/December 1975, pp. 1146–1150, the design allows beam deflection for raster scanning while achieving a large FOV. Possible design approaches can be classified into the following types: (1) post lens single deflection, (2) pre-lens double deflector, (3) single in-lens deflection, (4) single in-lens deflection, and (5) double in-lens deflection. A primary concern is that the beam travel through the lens center so that off-axis aberrations are minimized. This requirement sets restrictions on the size of the achievable field of view if resolution is not to be severely limited. To overcome this restriction, techniques like variable axis lens (VAL), described in H. PFEIFFER et al, Advanced deflection concept for large area, high resolution e-beam lithography, J. VAC. SCI. TECH., 19(4), November/December 1981, pp. 1058–1063, movable objective lens (MOL), described in E. GOTO et al, MOL (moving objective lens): Formulation of deflective aberration free system, OPTIK 48 (1977) No. 3, pp. 255–270, and other variations described in M. THOMSON, The electrostatic moving objective lens and optimized deflection systems for microcolumns, J. VAC. ScCI. TECH. B 14 (6), November/December 1996, pp. 3802–3807, employ at least one set of pre-deflectors to steer the beam off-center, then implement a way to compensate the effects of the beam traveling off-center, for example, dynamically move the effective position of the lens.

When the beam is far-off the center axis of the lens, it experiences a strong repulsive force caused by the lens field. That force tends to bend the beam back toward the lens center. This is the basic reason why the lens can focus. This bending force not only makes the raster area extremely small but also introduces severe aberrations; for instance, transverse chromatic aberrations, coma, astigmatism, etc., for off-axis operation. Compensation or correction of these aberrations is key to designing a large field of view lens and is accomplished by placing a second set of deflectors near the lens. These deflectors generate a field to offset or balance the lens bending field. The lens behaves as if its optical center were moved even though mechanically (physically) it remains fixed. Off-axis aberration correction in this manner allows practical implementation of a large field of view lens without suffering a loss of resolution from severe off-axis aberration.

Figure 7A:
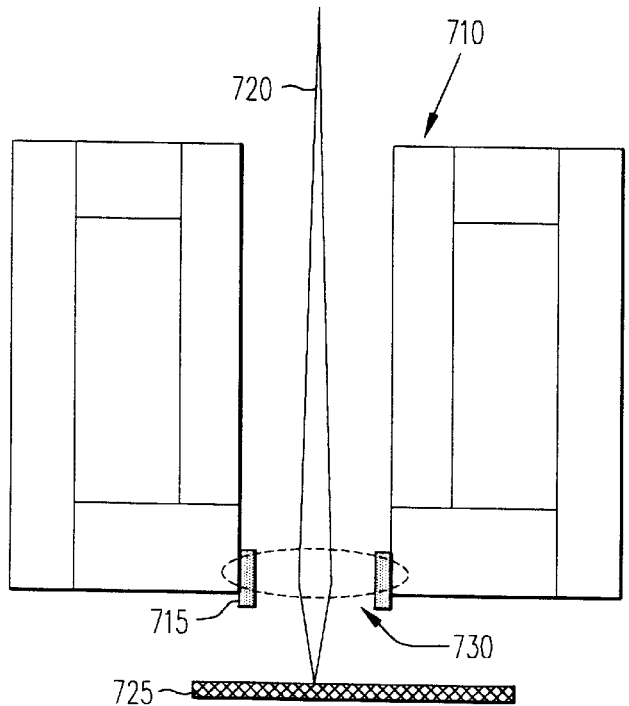
FIG. 7A illustrates the effective lens position of a lens having single deflection coils.
Figure 7B:
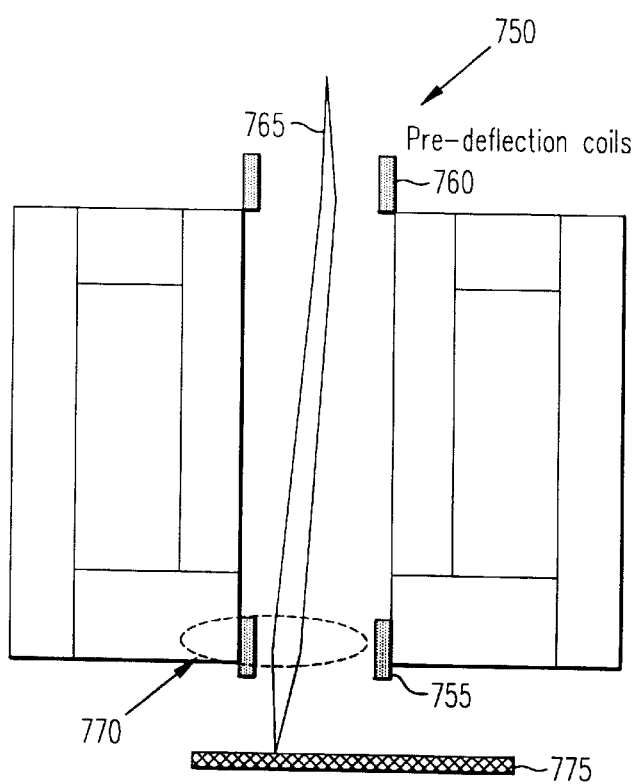
FIG. 7B illustrates the effective lens position of a moving-objective lens having dual deflection coils.

FIG. 7A and FIG. 7B illustrate the principle of a Movable Object Lens (MOL). Lens 710 shown schematically in FIG. 7A has a single set of deflection coils 715, capable of focusing beam 720 at the surface of a sample 725. The "effective" lens position is indicated by the dashed oval line 730. Aberrations result when the beam is deflected off-axis by deflection coils 715. Lens 750 shown schematically in FIG. 7B has a set of deflection coils 755 as well as a set of pre-deflection coils 760. Because beam 765 is pre-deflected by coils 760, the "effective" lens position can be shifted as indicated by the dashed oval line 770. The lens of FIG. 7B behaves as if its optical center were displaced, reducing off-axis aberration and producing substantially constant resolution over a large FOV of sample 775.

Figure 8:
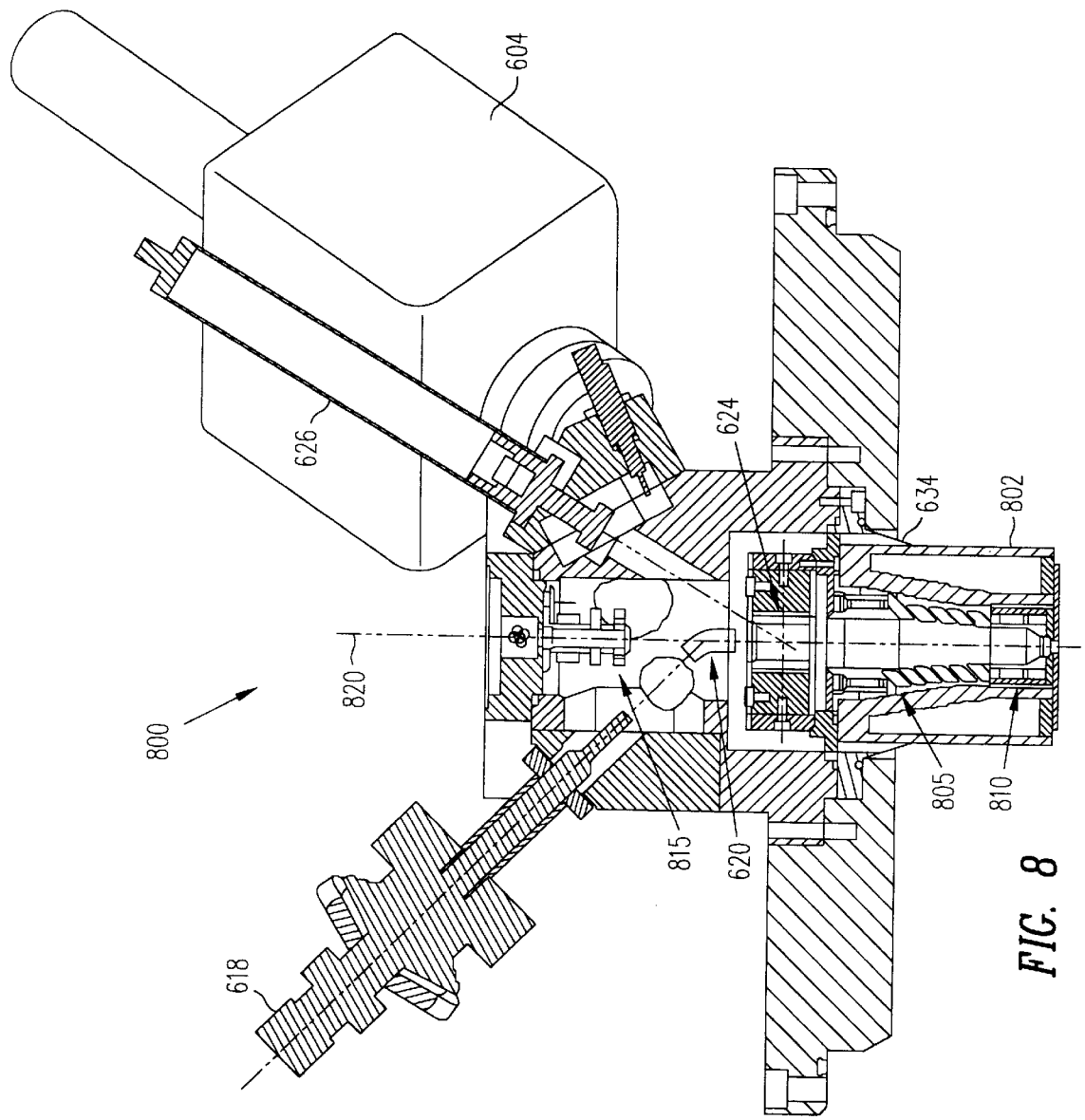
FIG. 8 is a cross-sectional view of a large-FOV objective lens useful in a defect-detection system consistent with the invention.

One possible implementation of an electron-optical column 800 including a large-FOV objective lens consistent with the invention is shown in cross-sectional view in FIG. 8. The large-FOV objective lens is similar to that used in Schlumberger's IDS 5000 e-beam probing system. While only a single set of deflection coils was used or required for the IDS 5000 system, the lens design of FIG. 8 includes a two sets of coils, sometimes referred to as saddle coils: pre-deflection coils 805 to steer the beam off the optical axis of the objective lens, and deflection coils 810 generating a field to optimize the lens transverse field, corresponding to the lens bending force described above, so that off-axis aberrations are reduced. Because the direction and magnitude of this transverse field is proportional to the beam location relative to the lens center, the field generated by the $2^{nd}$ deflector has to be adjusted accordingly to approximately balance that of the $1^{st}$ deflector while minimizing total aberration(s), as is standard in the design of any lens. In operation, the $1^{st}$ and $2^{nd}$ deflectors are raster scanned in tandem to generate images. The balance between the two vector fields can be accomplished by using a fixed winding ratio and fixed rotation angle between the $1^{st}$ and $2^{nd}$ deflector coils. Alternatively, the balance can be achieved by electronically setting the excitation ratio and rotation angle between the two deflectors. A cornmercially-available, charged-particle optics simulation package from MEBS Software, Cornwall Gardens, London, UK, has been successfully used to simulate and optimize such a lens design. The embodiment of FIG. 8 further includes alignment and astigmatism correction coils 815. The primary beam is shown at 820. Electron-optical column 800 produces a beam spot size of, for example, <0.1 $\mu$m across a 1 mm field of view.

In the embodiment shown in FIG. 8, no attempt is made to correct for the non-vertical beam landing angle, in contrast to e-beam lithography machines. A primary goal is to maximize the usable FOV so as to minimize the effect of stage-move time on system overhead when acquiring images from various regions of a sample. Accepting a non-vertical landing angle simplifies the design as no collimator lens is used (i.e., not telecentric) and only one pre-deflector is employed (i.e., the beam is not parallel to the lens axis). The beam landing angle can be up to ~15 degrees from the normal, which is acceptable for wafer inspection applications today. Any slight contrast variation can also be corrected by image normalization by using standard image processing routines.

High collection efficiency is key to this application as ultimately throughput is limited by shot noise and signal/image averaging time. Reduced collection efficiency would result in proportionately slower throughput.

More details can be found in U.S. patent application Ser. No. 09/227,396 filed on even herewith, now pending, the contents of have been incorporated herein by reference.

Image Processing and Image Alignment:

Once the images are acquired, image alignment and comparison is performed to detect defects. Each image is typically aligned to correct for misalignment for residual stage errors. Once aligned images, can be differenced in a number of ways:

conventional pixel-to-pixel subtraction in which each pixel of an image is subtracted from the corresponding pixel in a reference image. The resulting difference image then shows any real defects (image differences) as well as nuisance information caused by subtle but real differences between the images that are not killer defects. Image processing techniques such as feature erosion (dilation and expansion) can be used to minimize or eliminate those of the nuisance defects which are smaller than a selected size;

feature-based comparison in which the images are segmented into individual blobs or features for comparison on a feature-by-feature basis, such as described in co-pending U.S. patent application Ser. No. 09/227,747 filed on the same date as this application, now pending. Feature-based comparison is most valuable when the expected nuisance defects and actual defects are comparable in size, such as with contacts and vias. It also has the advantage of allowing spatial averaging to reduce shot noise beyond that achieved by temporal image averaging. An advantage is that more subtle voltage-contrast differences can be reliably differentiated without increasing the rate of nuisance defects.

Defect-detection methods and apparatus consistent with the invention can provide some implementation advantages:

Minimize stage overhead while maintaining flexibility to sample small portions of a wafer without compromising system throughput.

Avoid the need for an expensive scanning stage, allowing implementation with a relatively low-cost, low-accuracy stage because image-processing alignment can be used to avoid the need for accurate stage encoders.

Use of sub-FOVs to avoid the need for dynamic focus and astigmatism correction on-the-fly using the full FOV of a large-FOV lens. With the sub-FOV approach described, a simple lookup table of lens operating parameters can be set for each sub-FOV.

Pre-defined sub-FOVs can be used with a static lookup table to avoid dynamic alignment correction, with interpolation as appropriate between points in the pre-characterized look-up table. This approach can be used to compensate for mechanical alignment errors between the two deflection elements.

Avoid dynamic rotation correction in a similar manner.

Elegant, relatively simple and lower cost to implement than a traditional e-beam wafer inspection system such as the SEMSpec system.

Those of skill in the art will recognize that a variety of operating sequences consistent with the invention are possible. Following are a few examples:

1. Step-and-image, with no pre-charge flood and no multiple images per stage position
   Load wafer, pump down, align wafer, align die
   Set up imaging parameters, focus, astigmatism, area to be imaged
   REPEAT:
     acquire & store image
     IF reference image available (can be done while stage is moving)
       align acquired image and reference image (to correct for stage inaccuracy)
       compare/difference acquired image with reference image
       report differences/defects
     move to next adjacent position
     wait for stage to settle
   UNTIL area to be imaged is complete
   report or display defects (for example, in KLA wafer-map format)

2. Step-and-image with large-FOV objective lens (Assumes reference images have already been acquired using the same or similar procedure.)

Load wafer, pump down, align wafer (optical and or e-beam), align die (also optical and or e-beam)
Set up imaging parameters, energy, current, focus, astigmatism, area to be imaged, wafer, extraction and filter biases, image processing algorithm (typically all stored in a wafer recipe database)
REPEAT (acquire all images for the area(s) requested by the user)
  REPEAT (acquire all images for a single stage position with large-FOV objective lens)
    deflect beam to sub-FOV
    set/adjust imaging parameters (focus, stig, XY offset—from predetermined lookup table . . . )
    (optionally) pre-charge with flood gun (using the multiplexing 1
    acquire & store sub-FOV image (for example, 1000 pixels×1000 pixels)
    IF reference image available (ideally in parallel with setup and acquisition of next image)
    align acquired image & reference image (see Alignment Note below)
    compare/difference acquired image with reference image
    report differences/defects
  UNTIL all sub-FOV images for this stage position acquired
    move to next adjacent XY stage position OR next die IF current die complete
    wait for stage to settle
  UNTIL area to be imaged is complete
    report or display defects (for example, in KLA results file defect wafer map format)

Step and Image Alignment Note: 2–3 pixels using convolution or other algorithms—to correct for stage inaccuracy. Position or alignment repeatability of the large-FOV lens is likely to be high thus this alignment step may only be necessary on a few of the several hundred sub-FOV images acquired for each mechanical stage position. The alignment offset from neighboring images will in many cases be sufficient for alignment. A typical or likely approach might be to align only the first and last image from a set of sub-FOV images and to interpolate between these alignment offsets for all other images in the sub-FOV set.

In one embodiment of the invention, the whole of the larger FOV (e.g., greater than 100 mm across with a substantially uniform resolution over the FOV) can be acquired as a single image by applying dynamic astigmatism and focus corrections as is common in e-beam lithography systems. While this is more complex to implement than the sub-FOV imaging embodiment, it nevertheless can overcome the stage overhead problem.

Although experience to date suggests that voltage-contrast-based defect detection is a valuable mode of operation, some defects on some layers of a multi-layer wafer can only be detected with conventional SEM-style imaging; these include pattern defects, such as extra or missing pattern, that do not cause an open or short or do not change the voltage-contrast state of the associated features. There is little difference in the operation of the system when looking for these defects except that the wafer bias and extraction control parameters are no longer adjusted to maximize the voltage-contrast signal. Instead, the biases are set to zero or are set to maximize topographic contrast. Moreover, pattern defects can be significantly smaller than the minimum critical dimension of circuit feature size and higher magnification (more pixels per micron) may be required for reliable operation. The actual settings will vary depending on the material and layer inspected.

In a simple implementation consistent with the invention it is not necessary to use a flood beam. Pre-charging the sample by flooding the wafer has the advantages of requiring less beam time to obtain an image having good voltage contrast, and more uniform contrast due to a more uniform charge distribution within the imaged area as well as the surrounding area. Non-uniform charging in the area surrounding the imaged area can result in contrast variations across the field of view and increased false and nuisance defects. In a system equipped with a flood gun, a simple mode of operation is to pre-charge each sub-FOV with the flood beam prior to acquiring an image of that sub-FOV with the focused beam. This saves time due to faster charging than is possible with the focused beam but has the disadvantage of incurring a flood-beam-multiplexing overhead of tens to hundreds of microseconds per sub-FOV. If leakage currents on the wafer being inspected are low relative to the capacitance of the features to be imaged, flooding of multiple sub-FOVs can reduce the overhead per sub-FOV. Typical wafers inspected have had a discharge time constant from many tens of milliseconds to a few seconds. The typical frame rate is 10 ms to 100 ms per frame, so pre-charge flooding of a few sub-FOVs is a practical means to reducing multiplexing overhead. For large features such as bond pads and power planes that are typically on the uppermost metal layers, pre-charge flood of the whole FOV is possible. The flood gun implementation described can have a flood spot size on the order of ~100 $\mu$m across and so the flood beam must be raster scanned to cover the entire FOV of the large-FOV objective lens, which may be ~1 mm across.

A limiting factor in the speed of any e-beam-based detection system is the amount of beam current delivered to the sample, assuming that the video signal is processed perfectly, that image-processing algorithms are fully optimized, and that the best sampling plan is being applied. We have thus far described single-column implementation consistent with the invention. For large wafers (e.g., 200 mm and 300 mm diameter wafers), two or four or more columns can be mounted on the system together and used in parallel to increase the overall area coverage rate of the system. Each column in used in the step-and-image mode to image sub-FOVs. Each column may have its own set of support electronics and image-processing hardware. While more costly than a single-column system, a multiple-column system is expected to be less costly than multiple single-column systems because the mechanical stage, vacuum chamber, robot, user-interface computer, etc., are shared.

Figure 9:
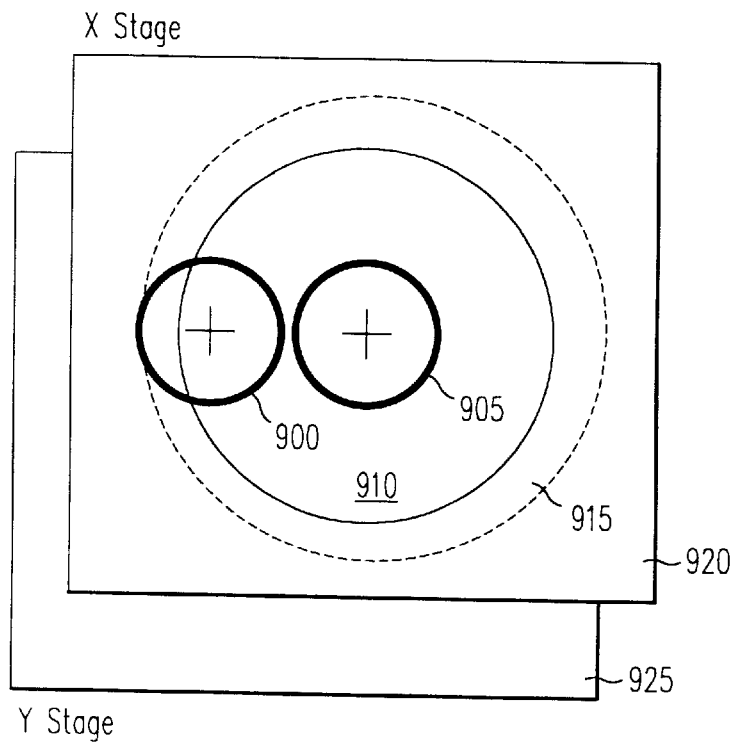
FIG. 9 shows a schematic, plan view of a defect-detection system consistent with the invention having two columns ganged together for simultaneously imaging multiple regions of a wafer.

FIG. 9 shows a schematic, plan view of a defect-detection system consistent with the invention having two columns ganged together for simultaneously imaging multiple regions of a wafer. Columns 900 and 905 are shown relative to a wafer 910 mounted on a wafer chuck 915 on an x-stage 920 and a y-stage 925.

Figure 10:
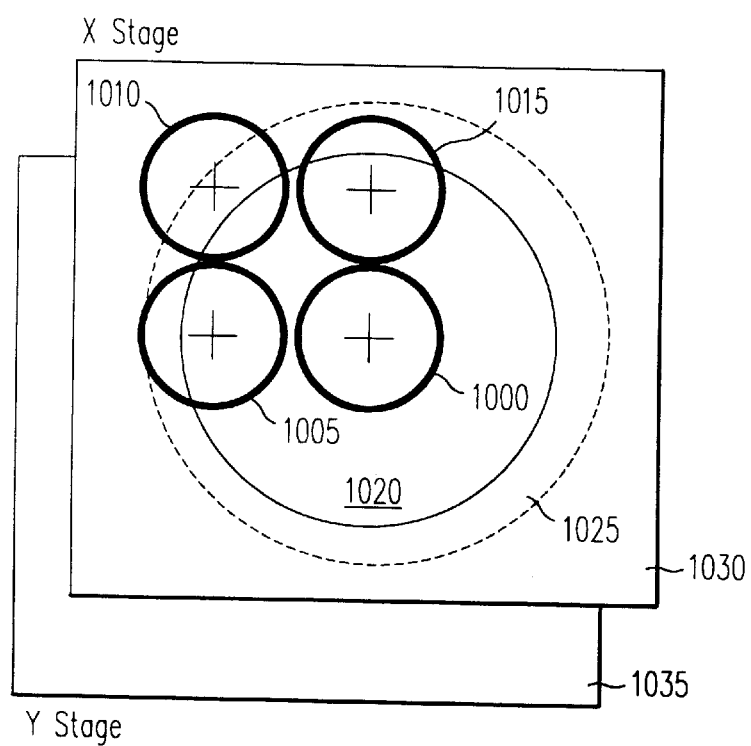
FIG. 10 shows a schematic, plan view of a defect-detection system consistent with the invention having four columns ganged together for simultaneously imaging multiple regions of a wafer.

FIG. 10 shows a schematic, plan view of a defect-detection system consistent with the invention having four columns ganged together for simultaneously imaging multiple regions of a wafer. Columns 1000, 1005, 1010 and 1015 are shown relative to a wafer 1020 mounted on a wafer chuck 1025 on an x-stage 1030 and a y-stage 1035.

Figure 11:
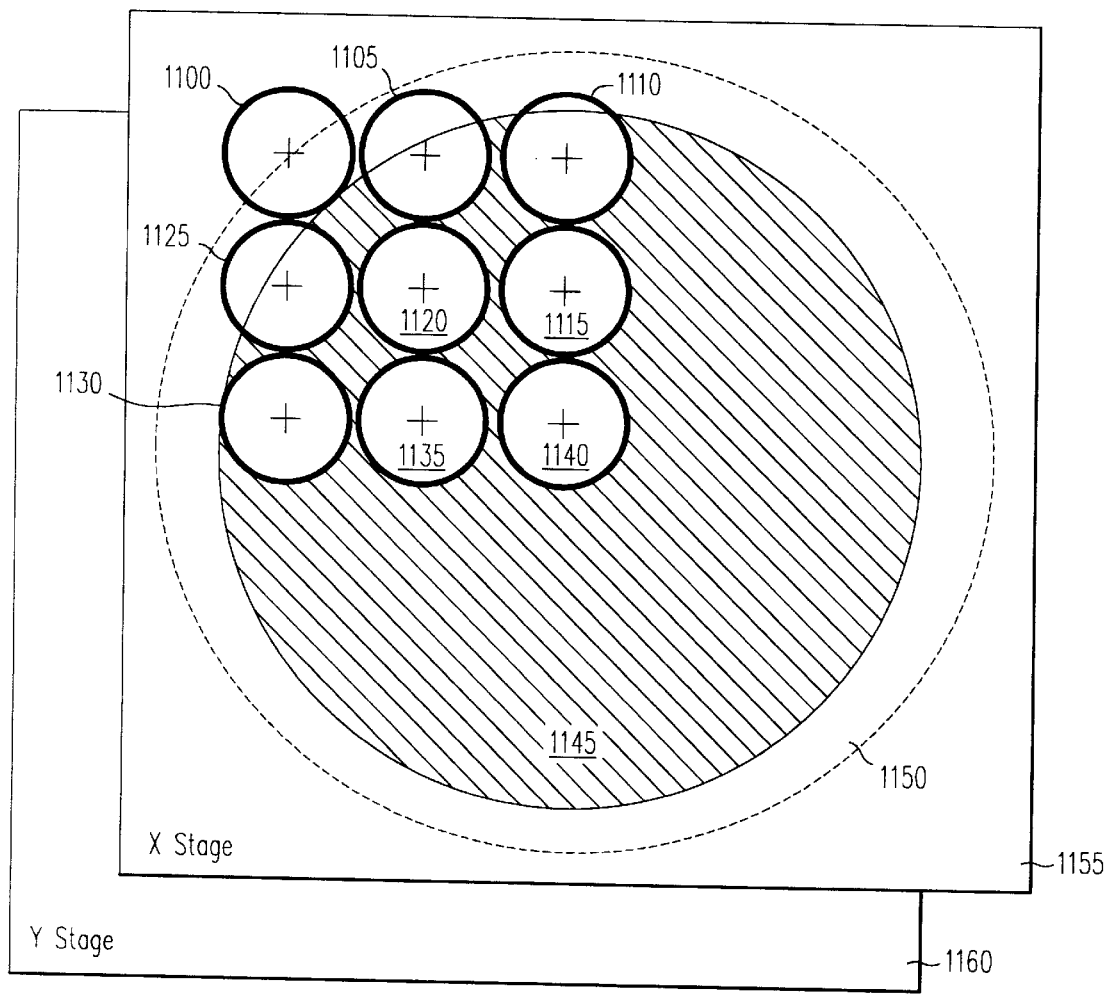
FIG. 11 shows a schematic, plan view of a defect-detection system consistent with the invention having nine columns ganged together for simultaneously imaging multiple regions of a wafer.

FIG. 11 shows a schematic, plan view of a defect-detection system consistent with the invention having nine columns ganged together for simultaneously imaging multiple regions of a wafer. Columns 1100, 1105, 1110, 1115, 1120, 1125, 1130, 1135 and 1140 are shown relative to a wafer 1145 mounted on a wafer chuck 1150 on an x-stage 1155 and a y-stage 1160.

Figure 12:
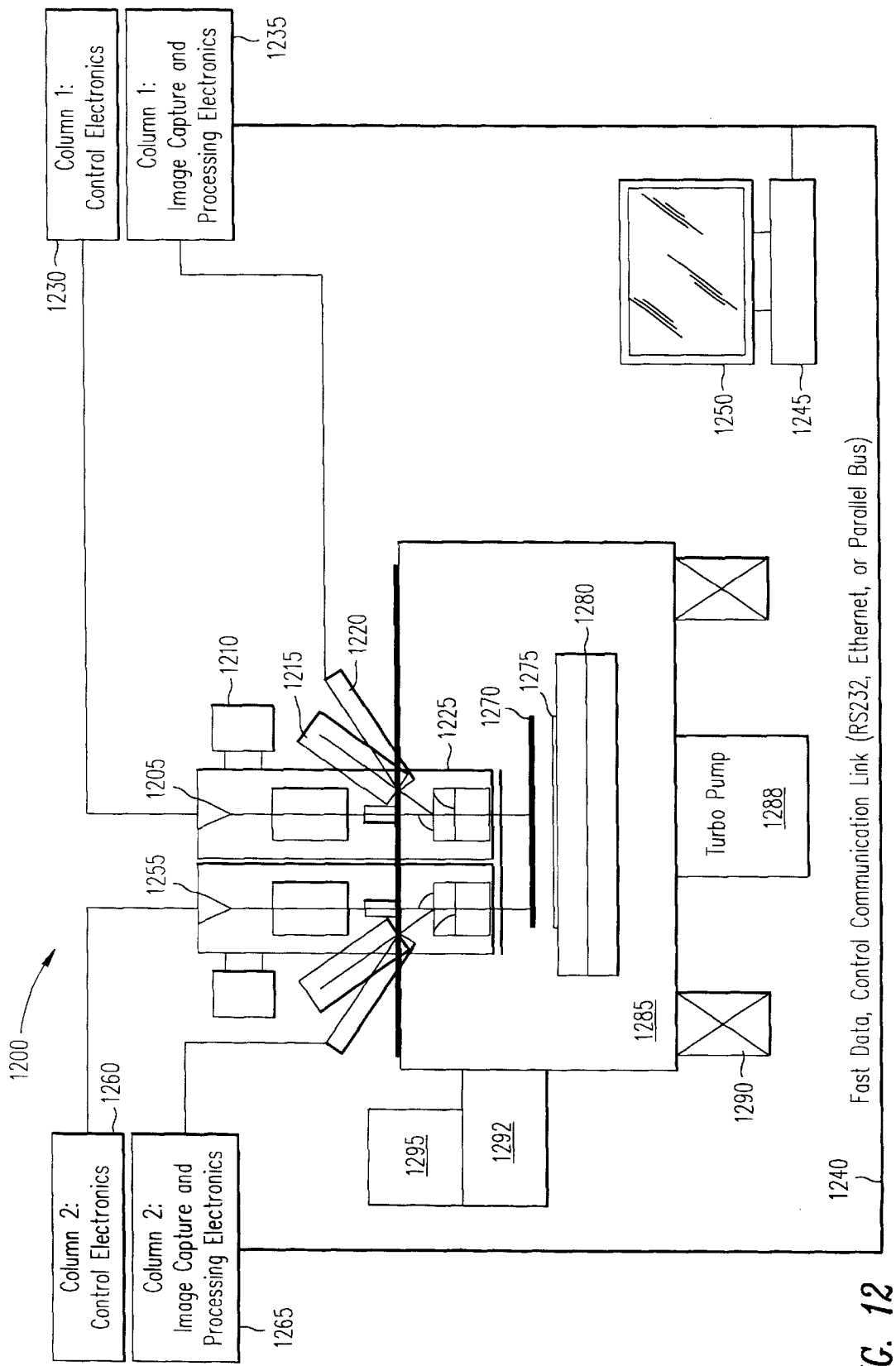
FIG. 12 shows a schematic view of a defect-detection system 1200 consistent with the invention having two columns ganged together for simultaneously imaging multiple regions of a wafer.

FIG. 12 shows a schematic view of a defect-detection system 1200 consistent with the invention having two columns ganged together for simultaneously imaging multiple regions of a wafer. A first column 1205 has a gun ion pump 1210, flood gun 1215, detector 1220 and large-FOV objective lens 1225. Provided for column 1205 are control electronics 1230 and image-capture and processing electronics 1235 in communication via bus 1240 with a control computer 1245 having a display 1250. A second column 1255 likewise has a gun ion pump, flood gun, detector and large-FOV objective lens. Provided for column 1255 are control electronics 1260 and image-capture and processing electronics 1265 in communication via bus 1240 with control computer 1245. Columns 1205 and 1255 can be operated simultaneously to image regions of a wafer 1270 carried by a wafer chuck 1275 on an X-Y stage 1280 in a vacuum chamber 1285. The system is also equipped with turbo pump 1288 for evacuating chamber 1285, active vibration isolation platform 1290, wafer-handling equipment 1292 (including a vacuum load lock and wafer-handling robots), and wafer cassette 1295.

The description given above is for an e-beam imaging system, though a system consistent with the invention can alternately employ an ion beam such as a hydrogen-ion beam or other non-Gallium-ion beam. The term "charged-particle beam" is intended to include an e-beam as well as an ion beam other than a Gallium-ion beam.

Those of skill in the art will recognize that these and other modifications can be made within the spirit and scope of the invention as defined in the claims.

What is claimed is:

1. A method of detecting defects in a patterned substrate, comprising:

(1) positioning a charged-particle-beam optical column relative to a patterned substrate, the charged-particle-beam optical column having a field of view (FOV) greater than approximately 100 microns with a substantially uniform resolution over the FOV;

(2) operating the charged-particle-beam optical column to acquire a plurality of images of a region of the patterned substrate lying within the FOV by scanning the charged-particle beam over the patterned substrate while maintaining the charged-particle-beam optical column fixed relative to the patterned substrate, each image being that of sububarea of the region and acquired at a sub-FOV; and (3) comparing the acquired images to a reference to identify defects in the patterned substrate.

2. The method of claim 1, wherein the charged-particle-beam column includes an electron-beam source.

3. The method of claim 2, wherein the electron-beam source includes a thermal-field-emission cathode.

4. The method of claim 2, wherein the electron-beam source includes a zirconium-tungsten cathode.

5. The method of claim 1, further comprising operating a mechanical stage to change the position of the charged-particle-beam optical column relative to the patterned substrate, and repeating steps 1, 2 and 3 to acquire images from a futher region of the patterned substrate.

6. The method of claim 1, further comprising monitoring position of the mechanical stage with a laser interferometer.

7. The method of claim 1, wherein operating the charged-particle-beam optical column to acquire images comprises acquiring voltage-contrast images.

8. The method of claim 1, ftirther comprising applying charged particles to pre-charge the patterned substrate prior to operating the charged-particle-beam optical column to acquire images.

9. The method of claim 1, wherein operating the charged-particle-beam optical column to acquire images comprises acquiring topographic images, and wherein comparing comprises comparing the acquired images to a reference to identify topographic defects in the patterned substrate.

10. The method of claim 1, wherein the reference image comprises an image of a portion of the patterned substrate.

11. The method of claim 1, wherein the reference image comprises a stored reference image.

12. The method of claim 1, wherein the reference image comprises an image generated from a computer-aided-design (CAD) database.

13. The method of claim 1, wherein comparing the acquired images comprises comparing features of the acquired images with features of a reference image to identify defects in the patterned substrate.

14. The method of claim 1, wherein the acquired images are comprised of pixels and the reference is a reference image comprised of pixels, and wherein comparing the acquired images comprises comparing the acquired images pixel-by-pixel with the reference image.

15. The method of claim 1, further comprising applying a flood beam to the patterned substrate prior to operating the charged-particle-beam optical column to acquire images.

16. The method of claim 15, wherein applying the flood beam to the patterned substrate comprises applying the flood beam to a sub-area of the FOV.

17. The method of claim 1, wherein the charged-particle-beam optical column comprises a variable-axis immersion lens (VAIL).

18. The method of claim 1, wherein the charged-particle-beam optical column includes an in-lens charged-particle detector for collecting and detecting secondary particles substantially uniformly across the FOV.

19. The method of claim 1, further comprising: positioning a second charge-particle-beam optical column relative to the patterned substrate, the second charged-particle optical column having a field of view (FOV) with a substantially uniform resolution over the FOV; operating the second charged-particle-beam optical column to acquire second images over multiple subareas of a region of the patterned substrate lying within the FOV by scanning the second charged-particle beam over the patterned substrate while maintaining the second charged-particle-beam optical column fixed relative to the patterned substrate; and comparing the acquired second images to a reference to identify defects in the patterned substrate.

* * * * *